United States Patent
Kuo et al.

(10) Patent No.: US 10,157,925 B1
(45) Date of Patent: Dec. 18, 2018

(54) IC STRUCTURE

(71) Applicant: Taiwan Semiconductor Manufacturing Co., Ltd., Hsinchu (TW)

(72) Inventors: Hsi-Yu Kuo, Hsinchu (TW); Yu-Lin Chu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/798,562

(22) Filed: Oct. 31, 2017

(51) Int. Cl.
| *H01L 27/092* | (2006.01) |
| *H01L 29/10* | (2006.01) |
| *H03K 3/356* | (2006.01) |
| *H01L 21/8238* | (2006.01) |

(52) U.S. Cl.
CPC .. *H01L 27/0921* (2013.01); *H01L 21/823807* (2013.01); *H01L 29/1083* (2013.01); *H01L 29/1095* (2013.01); *H03K 3/356104* (2013.01)

(58) Field of Classification Search
CPC .............. H01L 27/092; H01L 27/0921; H01L 27/0727; H01L 21/8238; H01L 21/823807; H01L 29/1083; H01L 29/1095
See application file for complete search history.

(56) References Cited

U.S. PATENT DOCUMENTS

| 9,553,508 | B1 * | 1/2017 | Chu | ..................... H01L 27/0266 |
| 9,906,224 | B1 * | 2/2018 | Chu | ..................... H03K 19/0948 |
| 2009/0278204 | A1 * | 11/2009 | Morino | ........... H01L 21/823892 257/356 |
| 2011/0310514 | A1 * | 12/2011 | Huang | ................... H01L 27/027 361/56 |
| 2012/0175708 | A1 * | 7/2012 | Schuetz | .......... H01L 21/823892 257/369 |
| 2013/0075856 | A1 * | 3/2013 | Tsai | ..................... H01L 27/0251 257/503 |
| 2013/0256801 | A1 * | 10/2013 | Yen | .................. H01L 21/823878 257/357 |
| 2015/0171069 | A1 * | 6/2015 | Su | ........................ H01L 27/0255 257/369 |
| 2017/0162558 | A1 * | 6/2017 | Chu | ..................... H01L 23/5226 |

* cited by examiner

*Primary Examiner* — Fazli Erdem
(74) *Attorney, Agent, or Firm* — McClure, Qualey & Rodack, LLP

(57) ABSTRACT

An IC structure is provided. The IC structure includes a P-type substrate, a deep N-well region in the substrate, a first N-well region on the deep N-well region, a first N-type doped region in the first N-well region, a second N-well region in the substrate, a first P-well region in the substrate, and a discharge circuit. The second N-well region and the first P-well region are separated from the deep N-well region. The discharge circuit includes a first P-type doped region in the first P-well region, a first PMOS transistor formed in the second N-well region, a first electrical path coupled between a source of the first PMOS transistor and the first N-type doped region, and a second electrical path coupled between a drain of the first PMOS transistor and the first P-type doped region.

20 Claims, 9 Drawing Sheets

IC STRUCTURE

BACKGROUND

Integrated circuits (ICs) have become increasingly important. Applications, such as cell phones, smart phones, tablets, laptops, notebook computers, PDAs, wireless email terminals, MP3 audio and video players, portable wireless web browsers and the like, using ICs are used by millions of people. Integrated circuits increasingly include powerful and efficient on-board data storage and logic circuitry for signal control and processing.

An increased density of devices in integrated circuits and a combination of various types of circuitry, such as logic and radio frequency processing circuits, have generally increased the amount of noise in various circuits. Noise can be detrimental in integrated circuits because signal integrity can be compromised, which can in turn cause a loss of data or errors in logic or signal processing.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

DETAILED DESCRIPTION

Figure 1:
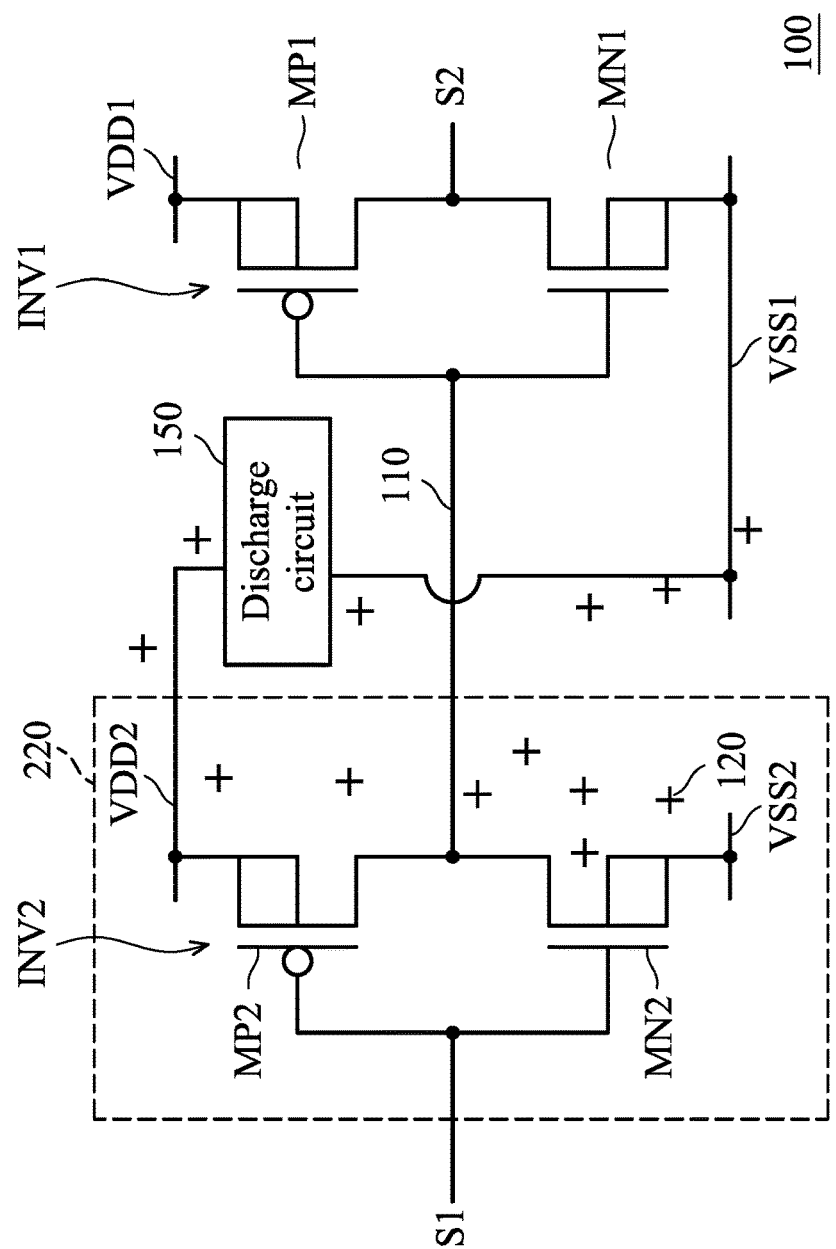
FIG. 1 shows a circuit diagram of an integrated circuit (IC), in accordance with some embodiments of the disclosure.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and the second nodes are formed in direct contact, and may also include embodiments in which additional nodes may be formed between the first and the second nodes, such that the first and the second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Moreover, spatially relative terms, for example, "lower," "upper," "horizontal," "vertical," "above," "below," "up," "down," "top," "bottom," "left," "right," etc. as well as derivatives thereof (e.g., "horizontally," "downwardly," "upwardly," etc.) are used for ease of the present disclosure of one feature's relationship to another feature. The spatially relative terms are intended to cover different orientations of the device including the features.

During integrated circuit (IC) manufacturing, various plasma processes may be used in fabricating devices and interconnects for connecting these devices. Plasma processes used in manufacturing devices may include, but are not limited to, reactive ion etch (RIE) used for removing materials on a semiconductor substrate, plasma-enhanced deposition for forming films, ion implantation for forming doped regions, and physical vapor deposition (PVD) for depositing conductive materials, etc. For example, a high density plasma (HDP) deposition may be used to deposit an inter-level dielectric (ILD) layer, or inter-metal dielectric (IMD) layer. Physical vapor deposition (PVD) that uses plasma discharge to sputter conductive materials off targets for depositing them on substrates to form contacts, and vias in the ILD layers. Plasma ions may directly contact a substrate surface and be implanted into the substrate. In addition, plasma ions may be transferred to a substrate indirectly. For example, plasma may be used to assist etching, such as in the case of reactive ion etch (RIE), to form openings or patterns in or on substrates. The openings generally extend to some underlying conductive feature, and the plasma used for the plasma process is able to contact the conductive feature and be transported into the substrate. In structures having devices with doped wells, charges from the plasma can be transferred through the conductive feature to the doped wells.

For the ICs, the deep doped wells are used to provide noise isolation for the signals of the ICs. However, during various processing operations, charges caused by process plasma may be transferred to and stored in the deep doped wells. Therefore, it is important to discharge the charges-accumulated in the deep doped wells or the metal connections thereof to prevent damage.

FIG. 1 shows a circuit diagram of an integrated circuit (IC) 100, in accordance with some embodiments of the disclosure. The IC 100 includes the inverters INV1 and INV2 and a discharge circuit 150.

The inverter INV1 includes a PMOS transistor MP1 and an NMOS transistor MN1. The PMOS transistor MP1 is coupled between a power line VDD1 and a drain of the NMOS transistor MN1, and the NMOS transistor MN1 is coupled between a grounding line VSS1 and a drain of the PMOS transistor MP1. A bulk of the PMOS transistor MP1 is coupled to the power line VDD1, and a bulk of the NMOS transistor MN1 is coupled to the grounding line VSS1. Furthermore, the gates of the PMOS transistor MP1 and the NMOS transistor MN1 are coupled together.

The inverter INV2 includes a PMOS transistor MP2 and an NMOS transistor MN2. The PMOS transistor MP2 is coupled between a power line VDD2 and a drain of the NMOS transistor MN2, and the NMOS transistor MN2 is coupled between a grounding line VSS2 and a drain of the PMOS transistor MP2. A bulk of the PMOS transistor MP2 is coupled to the power line VDD2, and a bulk of the NMOS transistor MN2 is coupled to the grounding line VSS2. Furthermore, the gates of the PMOS transistor MP2 and the NMOS transistor MN2 are coupled together. Through an electrical path (or signal path) 110, the drains of both the PMOS transistor MP2 and the NMOS transistor MN2 are coupled to an input of the inverter INV1, such as the gates of the PMOS transistor MP1 and the NMOS transistor MN1.

In some embodiments, the drains of the PMOS transistor MP2 and the NMOS transistor MN2 are also coupled to the gates of the PMOS and/or NMOS transistors of the other circuits within the IC 100 through multiple electrical paths.

When the IC 100 is powered, a first power supply is applied to the power line VDD1, and a second power supply is applied to the power line VDD2. In some embodiments, voltage levels of the first power supply and the second power supply are different for the IC 100. In some embodiments, the inverters INV1 and INV2 are implemented in an interface circuit (e.g. a voltage level shifter) between separated power domains of the IC 100. In some embodiments, the interface circuit is capable of adjusting voltage swing for signals. For example, the voltage level shifter is used to convert a signal S1 with voltage swing from a ground to the second power supply into a signal S2 with voltage swing form the ground to the first power supply. In some embodiments, the first power supply is greater than the second power supply. In some embodiments, the first power supply is less than the second power supply. In some embodiments, the first power supply is close to the second power supply.

The inverter INV2 is formed on a deep doped well region, such as a deep N-well region (also referred to as a DNW) 220. The deep doped well region is used for noise isolation or power gating purposes. Compared with a doped well region, the deep doped well region is located lower (or deeper into substrate) than the doped wells surrounding transistors and/or other devices. Furthermore, the deep doped well region is a relatively large region in comparison to the doped well region. The deep doped well region is capable of decreasing noise between other devices in the substrate and devices in the deep doped well region. In some embodiments, the circuits or devices having mixed signals or radio frequency (RF) signals for high speed applications within the IC, are susceptible to noise interference. Therefore, such devices or circuits may employ the deep doped well regions for noise reduction.

When the IC 100 is being manufactured, many manufacturing processes involve plasma, and then ions in the plasma could accumulate in various layers in and/or on the substrate of the IC 100. For example, during RIE, the substrate of the IC 100 is biased to attract positive etching ions to increase the ion energy and etch rate. As described above, the deep N-well region 220 is a relatively large region. As a result, charges 120 accumulated in the deep N-well region 220 could be fairly significant. In some embodiments, the charges 120 accumulated in the deep N-well region 220 could be a result of one or more plasma processing operations, such as etching, film deposition, and ion implant, etc. In some embodiments, the charges 120 accumulated in the deep N-well region 220 could be a result of one or more package operations.

A discharge circuit 150 is coupled between the power line VDD2 and the grounding line VSS1. The discharge circuit 150 is capable of discharging the charges 120 accumulated in the deep N-well region 220 to the substrate of the IC 100 without passing through the transistors (e.g., the NMOS transistor MN1) coupled to the electrical path 110, so as to avoid damaging the gate (e.g., gate oxide or gate dielectric) of the NMOS transistors. Therefore, the yield of the IC 100 increases.

In some embodiments, each deep N-well region 220 of the IC 100 has its own discharge circuit 150. Specifically, the number of discharge circuits 150 is determined by the number of deep N-well regions 220 rather than by the devices or circuits coupled to the electrical path 110. Thus, the layout of the IC 100 is more flexible, and the area of the IC 100 is decreased.

Figure 2A:
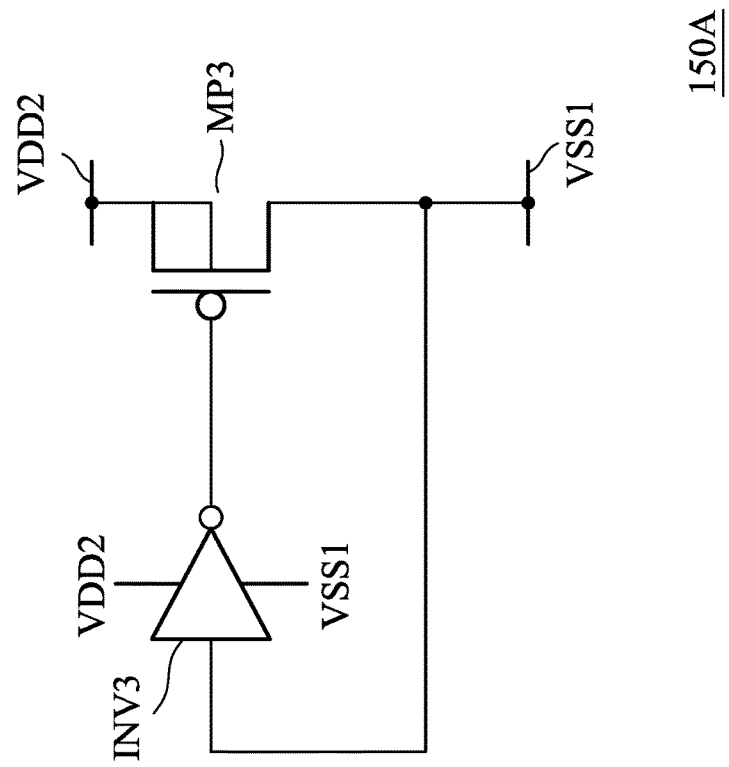
FIG. 2A shows a circuit diagram illustrating a discharge circuit, in accordance with some embodiments of the disclosure.

FIG. 2A shows a circuit diagram illustrating a discharge circuit 150A, in accordance with some embodiments of the disclosure. As described above, the discharge circuit 150A is coupled between the power line VDD2 and the grounding line VSS1.

The discharge circuit 150A includes a PMOS transistor MP3 and an inverter INV3. A drain of the PMOS transistor MP3 is coupled to the grounding line VSS1, and a source and a bulk of the PMOS transistor MP3 are both coupled to the power line VDD2. Furthermore, an output terminal of the inverter INV3 is coupled to a gate of the PMOS transistor MP3, and an input terminal of the inverter INV3 is coupled to the grounding line VSS1.

In some embodiments, the bulk of the PMOS transistor MP3 is coupled to the power line VDD1 when a voltage difference between the first power supply applied to the power line VDD1 and the second power supply applied to the power line VDD2 is less than a predetermined voltage value.

The inverter INV3 includes a PMOS transistor MP4 (not shown) and an NMOS transistor MN4 (not shown). Similar to the inverter INV1, the PMOS transistor MP4 is coupled between the power line VDD2 and a drain of the NMOS transistor MN4, and the NMOS transistor MN4 is coupled between the grounding line VSS1 and a drain of the PMOS transistor MP4. A bulk of the PMOS transistor MP4 is coupled to the power line VDD2, and a bulk of the NMOS transistor MN4 is coupled to the grounding line VSS1. Furthermore, both the gates of the PMOS transistor MP4 and the NMOS transistor MN4 (i.e., the input terminal of the inverter INV3) are coupled to the grounding line VSS1, and both the drains of the PMOS transistor MP4 and the NMOS transistor MN4 (i.e., the output terminal of the inverter INV3) are coupled to the gate of the PMOS transistor MP3.

Although the inverter INV3 is used to control the gate of the PMOS transistor MP3, so as to discharge positive or negative charges that are caused by or attracted to the charges in the deep N-well region 220, other devices or circuits with similar function may also be used.

Figure 2B:
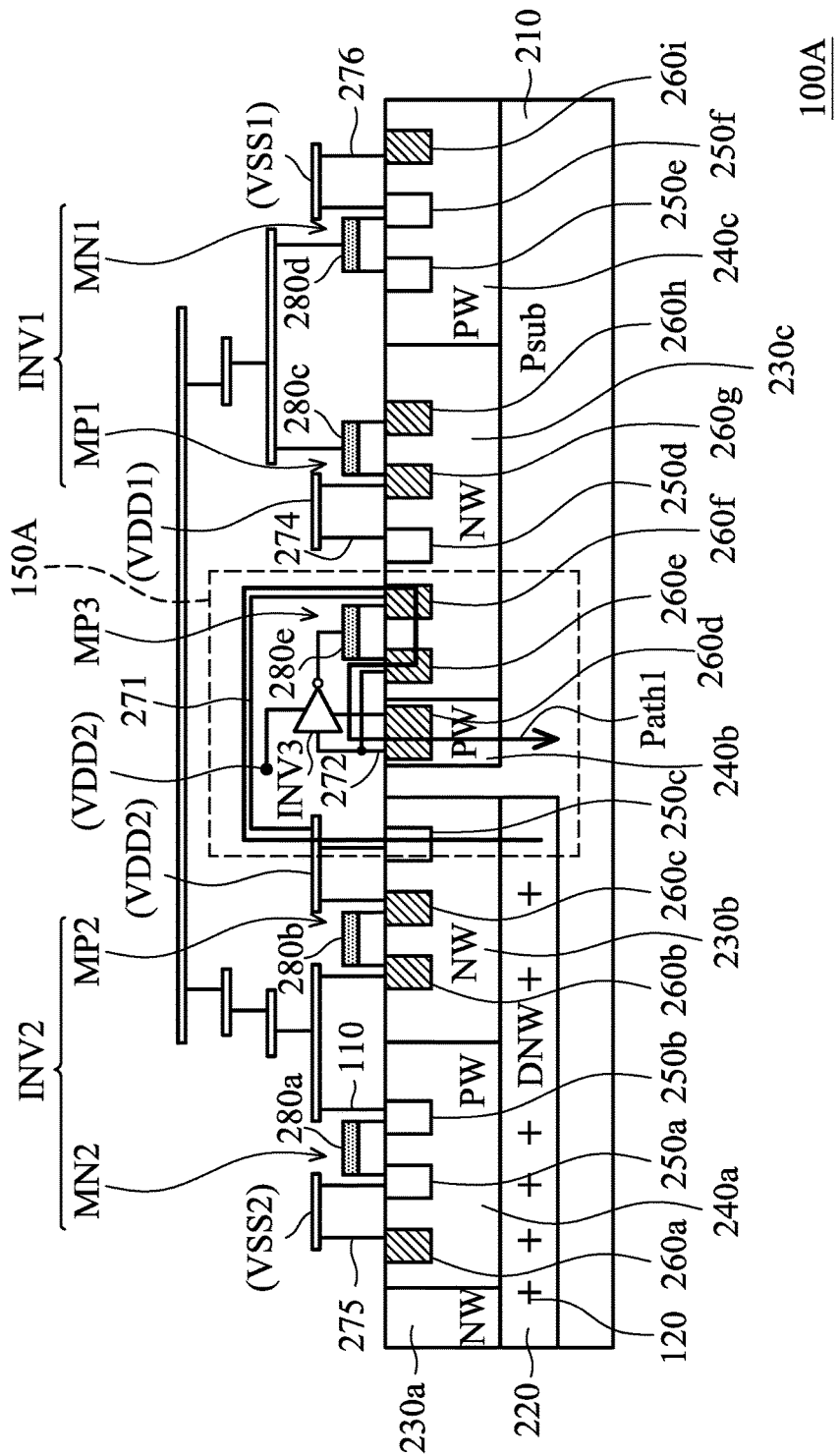
FIG. 2B shows a schematic cross-sectional view illustrating a structure of an IC, in accordance with some embodiments of the disclosure.

FIG. 2B shows a schematic cross-sectional view illustrating the structure of an IC 100A, in accordance with some embodiments of the disclosure. In some embodiments, The IC 100A includes the discharge circuit 150A of FIG. 2A and the inverters INV1 and INV2 of FIG. 1.

The IC 100A includes a P-type substrate (also referred to as a Psub) 210. A deep N-well region 220 is formed in the P-type substrate 210. The N-well regions 230a and 230b and the P-well region 240a are formed on the deep N-well region 220, and the N-well regions 230a and 230b are separated by the P-well region 240a.

The NMOS transistor MN2 of the inverter INV2 is formed in the P-well region 240a. The N-type doped regions 250a and 250b and the P-type doped region 260a are arranged in the P-well region 240a. The N-type doped regions 250a and 250b form the source and the drain of the NMOS transistor MN2, respectively. The P-type doped region 260a forms the bulk of the NMOS transistor MN2. The N-type doped region 250a and the P-type doped region 260a are coupled to the grounding line VSS2 through an electrical path 275. The electrical path 275 can be formed by one or more metal layers and multiple vias between the metal layers.

The PMOS transistor MP2 of the inverter INV2 is formed in the N-well region 230b. The P-type doped regions 260c and 260b and the N-type doped region 250c are arranged in the N-well region 230b. The P-type doped regions 260c and 260b form the source and the drain of the PMOS transistor MP2, respectively. The N-type doped region 250c forms the bulk of the PMOS transistor MP2. The N-type doped region 250c and the P-type doped region 260c are coupled to the power line VDD2 through the electrical path 271. The electrical path 271 can be formed by one or more metal layers and multiple vias between the metal layers.

In the IC 100A, the N-well region 230c and the P-well regions 240b and 240c are formed in the P-type substrate 210. The P-well regions 240b and 240c are separated by the N-well region 230c.

The NMOS transistor MN1 of the inverter INV1 is formed in the P-well region 240c. The N-type doped regions 250f and 250e and the P-type doped region 260i are arranged in the P-well region 240c. The N-type doped regions 250f and 250e form the source and the drain of the NMOS transistor MN1, respectively. The P-type doped region 260i forms the bulk of the NMOS transistor MN1. The N-type doped region 250f and the P-type doped region 260i are coupled to the grounding line VSS1 through an electrical path 276. The electrical path 276 can be formed by one or more metal layers and multiple vias between the metal layers.

The PMOS transistor MP1 of the inverter INV1 is formed in the N-well region 230c. The P-type doped regions 260g and 260h and the N-type doped region 250d are arranged in the N-well region 230c. The P-type doped regions 260g and 260h form the source and the drain of the PMOS transistor MP1, respectively. The N-type doped region 250d forms the bulk of the PMOS transistor MP1. The N-type doped region 250d and the P-type doped region 260g are coupled to the power line VDD1 through the electrical path 274. The electrical path 274 can be formed by one or more metal layers and multiple vias between the metal layers. The gate 280c of the PMOS transistor MP1 is coupled to the gate 280d of the NMOS transistor MN1 through the electrical path 110. Simultaneously, the gate 280c of the PMOS transistor MP1 is also coupled to the drain (i.e., N-type doped region 250b) of the NMOS transistor MN2 and the drain (i.e., P-type doped region 260b) of the PMOS transistor MP2.

The PMOS transistor MP3 of the discharge circuit 150A is formed in the N-well region 230c. The P-type doped regions 260f and 260e are also arranged in the N-well region 230c. The P-type doped regions 260f and 260e form the source and the drain of the PMOS transistor MP3, respectively. The N-type doped region 250d forms the bulk of the PMOS transistor MP3, and the N-type doped region 250d is coupled to the power line VDD1 through the electrical path 274. In such embodiments, the PMOS transistors MP1 and MP3 share the N-type doped region 250d, and the bulk of the PMOS transistor MP3 is not coupled to the source of the PMOS transistor MP3. In some embodiments, an additional N-type doped region (not shown) is arranged between the N-type doped region 250d and the P-type doped region 260f, and the additional N-type doped region is coupled to the power line VDD2 through an electrical path 271. Furthermore, the additional N-type doped region forms the bulk of the PMOS transistor MP3, and the bulk of the PMOS transistor MP3 is coupled to the source of the PMOS transistor MP3.

Similarly, the PMOS transistor MP4 and the NMOS transistor MN4 of the inverter INV3 are formed in the P-type substrate 210. In order to simplify the description, the formations of the inverter INV3 will be omitted. The inverter INV3 has an output terminal coupled the gate 280e of the PMOS transistor MP3, and has an input terminal coupled to the P-type doped regions 260d and the 260e through the electrical path 272. The P-type doped region 260d is arranged in the P-well region 240b, and the P-type doped region 260e is arranged in the N-well region 230c.

Figure 2C:
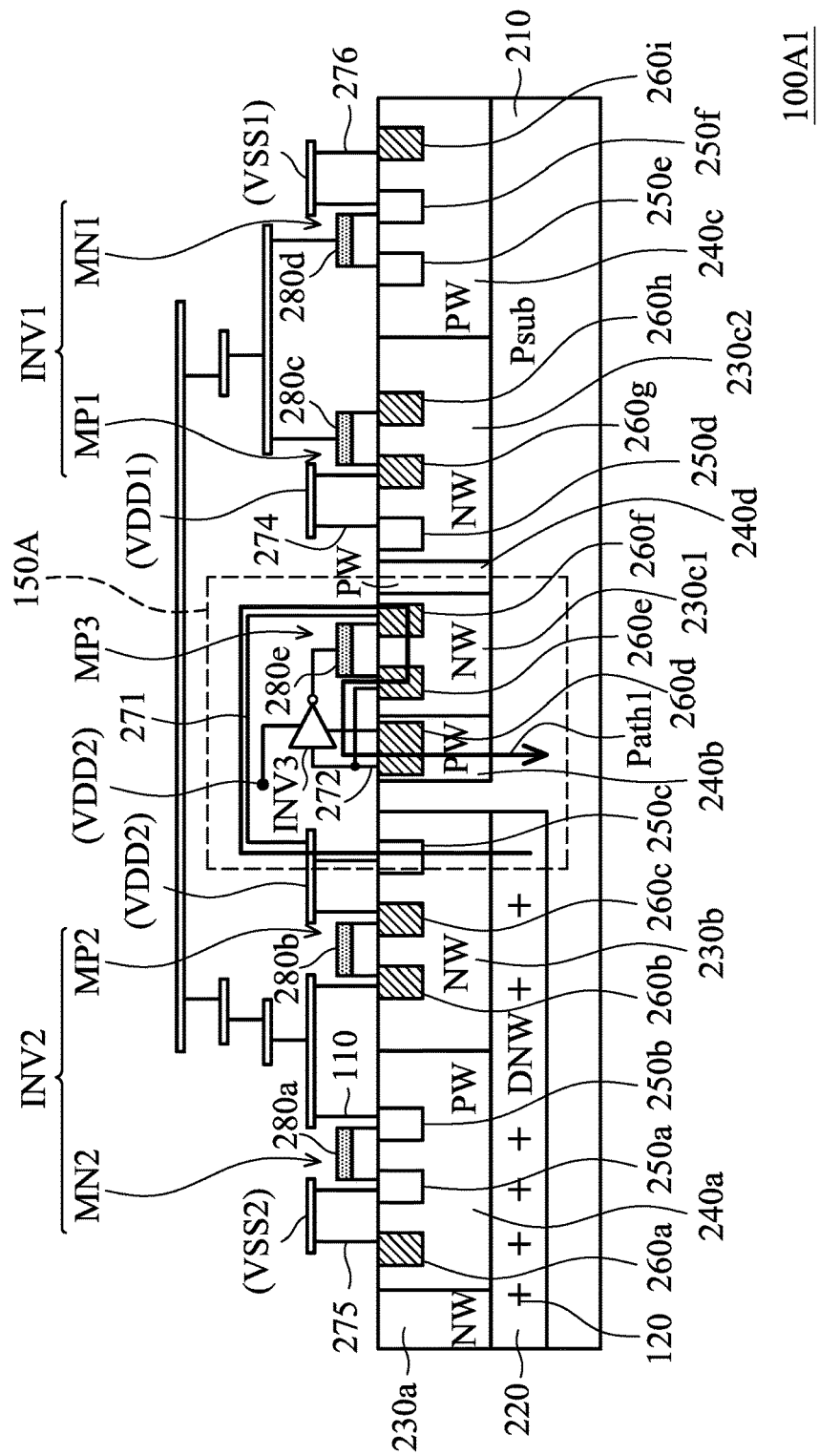
FIG. 2C shows a schematic cross-sectional view illustrating the structure of an IC, in accordance with some embodiments of the disclosure.

FIG. 2C shows a schematic cross-sectional view illustrating the structure of an IC 100A1, in accordance with some embodiments of the disclosure. In some embodiments, The IC 100A1 includes the discharge circuit 150A of FIG. 2A and the inverters INV1 and INV2 of FIG. 1.

Compared with the IC 100A of FIG. 2B, in the IC 100A1 of FIG. 2C, the PMOS transistor MP1 of the inverter INV1 is formed in the N-well region 230c2 of the IC 100A1, and the PMOS transistor MP3 of the discharge circuit 150A is formed in the N-well region 230c1 of the IC 100A1. Furthermore, the N-well regions 230c1 and 230c2 are separated from each other. In some embodiments, the N-well regions 230c1 and 230c2 are separated by the P-well region 240d.

During the process of manufacturing the IC 100A/100A1, no power supply (e.g., the first or second power supply) is applied to the IC 100A/100A1. When the P-type substrate 210 is coupled to a ground through a process apparatus, a discharge path Path1 is present and the discharge path Path1 is caused by a channel current of the PMOS transistor MP3 due to the gate of the PMOS transistor MP3 being a floating gate during the manufacturing process. Thus, the charges 120 accumulated in the deep N-well region 220 are discharged to the ground through the P-type substrate 210 and the discharge path Path1 without passing through the electrical path 110, thereby avoiding damage to the gates of the transistors (e.g., the NMOS transistor MN1) coupled to the electrical path 110.

The charges flow from the gates of the transistors through the conductive layers, and the conductive layers act as the antenna to collect the positive ions. Antenna plasma damage mainly results from backend processing, which involves backend plasma processes, such as deposition and etching of dielectric and metal layers.

The discharge path Path1 is formed from the deep N-well region 220 to the P-type substrate 210 through the N-well region 230b, the N-type doped region 250c, the electrical path 271, a channel of the PMOS transistor MP3 between the P-type doped regions 260e and 260f, the electrical path 272, the P-type doped region 260d and the P-well region 240b in sequence.

After the IC 100A/100A1 is completed, the first and second power supplies are applied to the power lines VDD1 and VDD2 of the IC 100A/100A1 during normal operation, respectively. Furthermore, a ground is coupled to the P-type substrate 210 and the grounding lines VSS1 and VSS2 of the IC 100A/100A1. Thus, the input terminal of the inverter INV3 of the discharge circuit 150A is coupled to the ground through the P-type doped region 260d, the P-well region 240b and the P-type substrate 210, and then the inverter INV3 provides a high logic level signal to the gate 280e of the PMOS transistor MP3, so as to turn off the PMOS transistor MP3. Therefore, no discharge path Path1 is present in the IC 100A/100A1 during normal operation.

Figure 3A:
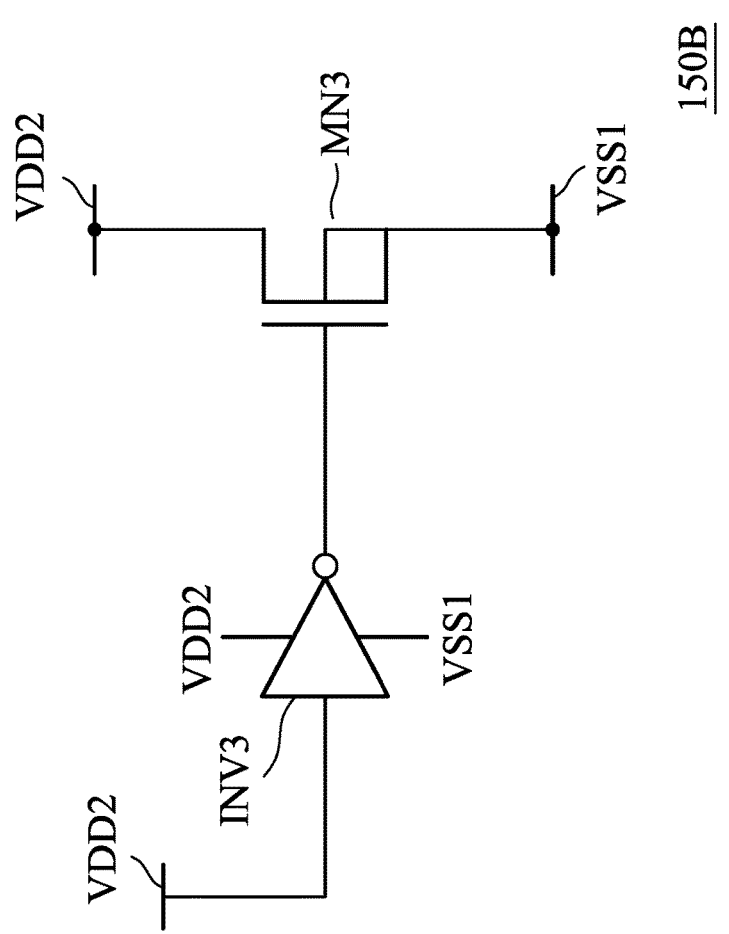
FIG. 3A shows a circuit diagram illustrating a discharge circuit, in accordance with some embodiments of the disclosure.

FIG. 3A shows a circuit diagram illustrating a discharge circuit 150B, in accordance with some embodiments of the disclosure. As described above, the discharge circuit 150B is coupled between the power line VDD2 and the grounding line VSS1.

The discharge circuit 150B includes an NMOS transistor MN3 and an inverter INV3. A source and a bulk of the NMOS transistor MN3 are both coupled to the grounding line VSS1, and a drain of the NMOS transistor MN3 is coupled to the power line VDD2. Furthermore, an output terminal of the inverter INV3 is coupled to a gate of the NMOS transistor MN3, and an input terminal of the inverter INV3 is coupled to the power line VDD2. Although the inverter INV3 is used to control the gate of the NMOS transistor MN3, so as to discharge positive or negative charges that are caused by or attracted to the charges in the deep N-well region 220, other devices or circuits with similar function may also be used.

Figure 3B:
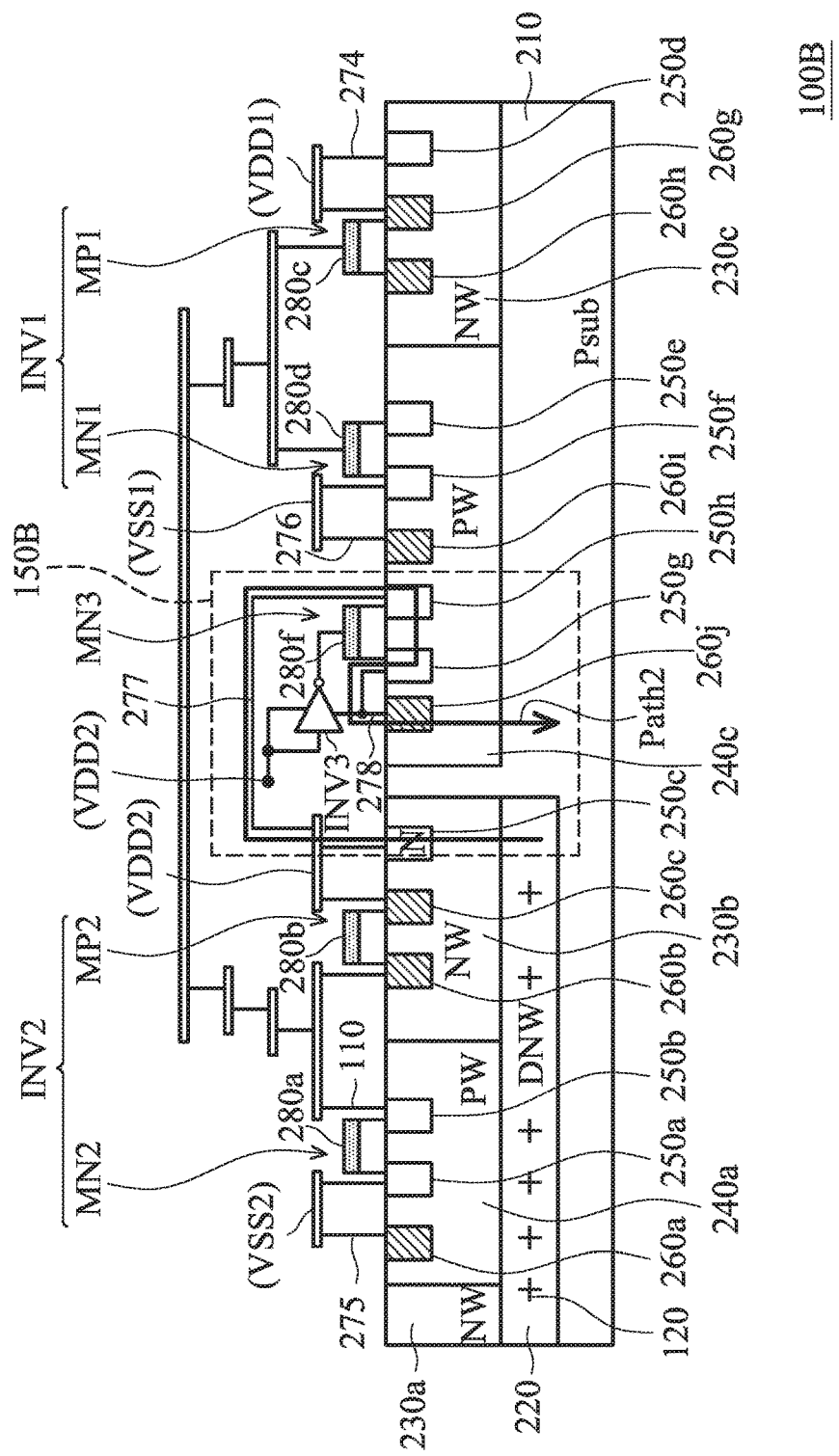
FIG. 3B shows a schematic cross-sectional view illustrating the structure of an IC, in accordance with some embodiments of the disclosure.

FIG. 3B shows a schematic cross-sectional view illustrating the structure of an IC 100B, in accordance with some embodiments of the disclosure. In some embodiments, The IC 100B includes the discharge circuit 150B of FIG. 3A and the inverters INV1 and INV2 of FIG. 1.

The IC 100B includes a P-type substrate (also referred to as a Psub) 210. A deep N-well region 220 is formed in the P-type substrate 210. The N-well regions 230a and 230b and the P-well region 240a are formed on the deep N-well region 220, and the N-well regions 230a and 230b are separated by the P-well region 240a. Furthermore, N-well region 230c and P-well region 240c are formed in the P-type substrate 210 and separated from the deep N-well region 220.

In order to simplify the description, the configuration of PMOS transistors MP1 and MP2 and NMOS transistors MN1 and MN2 of the IC 100B in FIG. 3B are similar to that of PMOS transistors MP1 and MP2 and NMOS transistors MN1 and MN2 of the IC 100A in FIG. 3A. In some embodiments, the configuration of PMOS transistors MP1 and MP2 and NMOS transistors MN1 and MN2 may be determined to suit various applications or designs.

The NMOS transistor MN3 of the discharge circuit 150B is formed in the P-well region 240c. The N-type doped regions 250g and 250h and the P-type doped region 260j are also arranged in the P-well region 240c. The N-type doped regions 250g and 250h form the source and the drain of the NMOS transistor MN3, respectively. The P-type doped region 260j forms the bulk of the NMOS transistor MN3, and the P-type doped region 260j is coupled to the N-type doped region 250g and the grounding line VSS1 of the inverter INV3 through the electrical path 278. The inverter INV3 of the discharge circuit 150B has an output terminal coupled the gate 280f of the NMOS transistor MN3, and has an input terminal coupled to the power line VDD2.

Figure 3C:
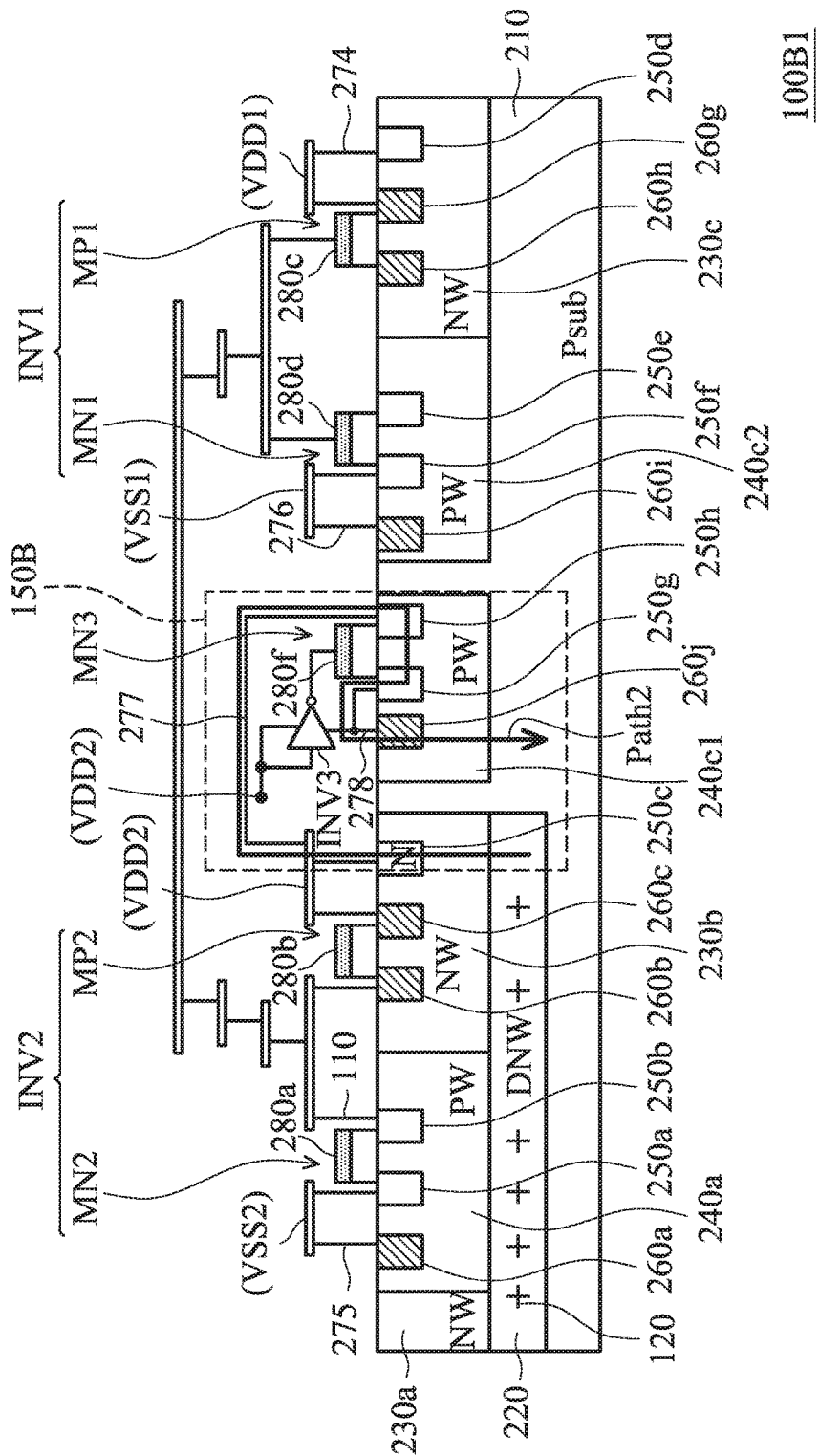
FIG. 3C shows a schematic cross-sectional view illustrating the structure of an IC, in accordance with some embodiments of the disclosure.

FIG. 3C shows a schematic cross-sectional view illustrating the structure of an IC 100B1, in accordance with some embodiments of the disclosure. In some embodiments, The IC 100B1 includes the discharge circuit 150B of FIG. 3A and the inverters INV1 and INV2 of FIG. 1.

Compared with the IC 100B of FIG. 3B, in the IC 100B1 of FIG. 3C, the NMOS transistor MN1 of the inverter INV1 is formed in the P-well region 240c2 of the IC 100B1, and the NMOS transistor MN3 of the discharge circuit 150B is formed in the P-well region 240c1 of the IC 100B1. Furthermore, the P-well regions 240c1 and 240c2 are separated from each other. In some embodiments, the P-well regions 240c1 and 240c2 are separated by the P-type substrate 210.

During the process of manufacturing the IC 100B/100B1, no power supply (e.g., the first or second power supply) is applied to the IC 100B/100B1. When the P-type substrate 210 is coupled to a ground through a process apparatus, a discharge path Path2 is present and the discharge path Path2 is caused by a channel current of the NMOS transistor MN3 due to the gate of the NMOS transistor MN3 being a floating gate during the manufacturing process. Thus, the charges 120 accumulated in the deep N-well region 220 are discharged to the P-type substrate 210 and the discharge path Path2 without passing through the electrical path 110, thereby avoiding damage to the gates of the transistors coupled to the electrical path 110. The discharge path Path2 is formed from the deep N-well region 220 to the P-type substrate 210 through the N-well region 230b, the N-type doped region 250c, the electrical path 277, a channel of the NMOS transistor MN3 between the N-type doped regions 250h and 250g, the electrical path 278, the P-type doped region 260j and the P-well region 240c1 in sequence.

After the IC 100B/100B1 is completed, the first and second power supplies are respectively applied to power lines VDD1 and VDD2 of the IC 100B/100B1 during normal operation. Furthermore, a ground is coupled to the P-type substrate 210 and the grounding lines VSS1 and VSS2 of the IC 100B/100B1. Thus, the input terminal of the inverter INV3 of the discharge circuit 150B is coupled to the power line VDD2, and then the inverter INV3 provides a low logic level signal to the gate 280f of the NMOS transistor MN3, so as to turn off the NMOS transistor MN3. Therefore, no discharge path Path2 is present in the IC 100B/100B1 during normal operation.

Figure 4:
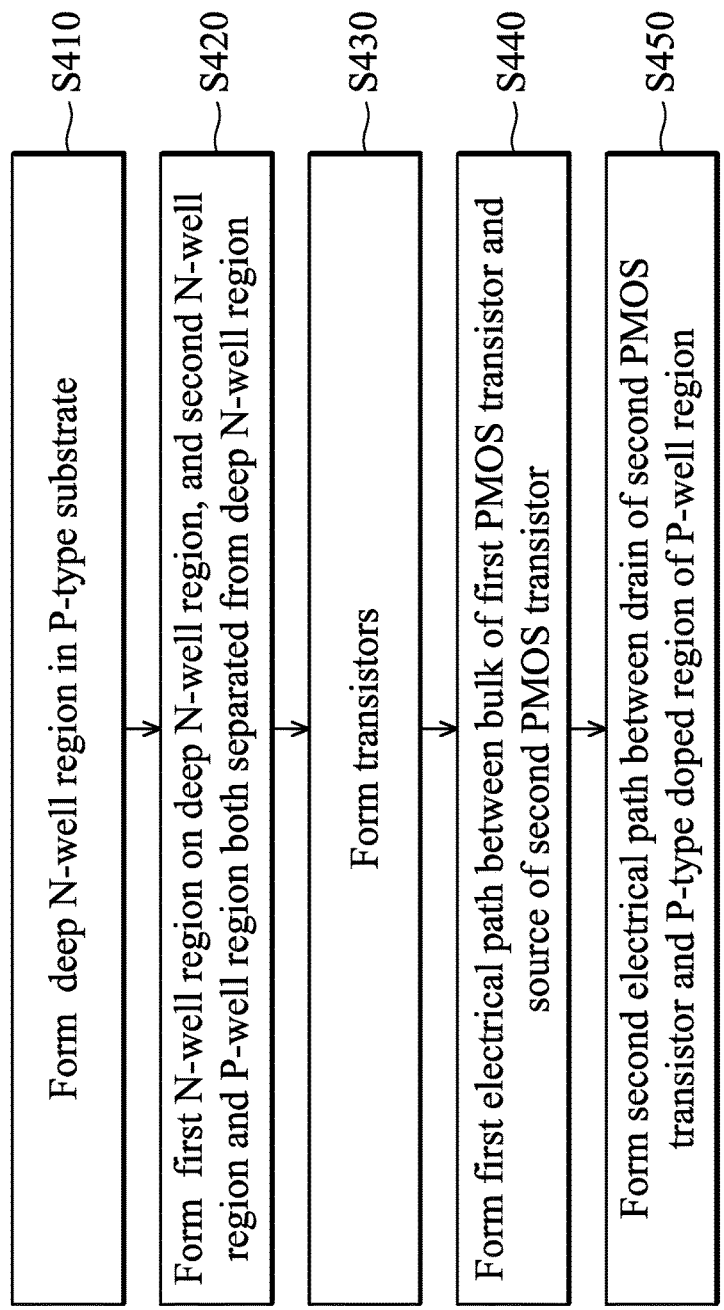
FIG. 4 shows a simplified flowchart illustrating a method for forming the integrated circuit of FIG. 2B, in accordance with some embodiments of the disclosure.

FIG. 4 shows a simplified flowchart illustrating a method for forming the integrated circuit 100A of FIG. 2B, in accordance with some embodiments of the disclosure.

In operation S410, the deep N-well region 220 is formed in the P-type substrate 210 of the IC 100A.

In operation S420, the N-well regions 230a through 230c and the P-well regions 240a through 240c are formed. The N-well regions 230a and 230b and the P-well region 240a are formed on the deep N-well region 220. Furthermore, the N-well region 230c and the P-well regions 240b and 240c are formed and separated from the deep N-well region 220. Furthermore, the N-type doped regions and the P-type doped regions are formed in the corresponding well regions. As described above, the N-well region 230c is divided into the N-well regions 230c1 and 230c2. Furthermore, the N-well regions 230c1 and 230c2 are separated from each other.

In operation S430, the transistors of the integrated circuit 100A are formed. For example, the PMOS transistor MP2 is formed in the N-well region 230b. The PMOS transistor MP3 is formed in the N-well region 230c. The inverter INV3 is formed in the P-type substrate 210.

In order to simplify the description, details of the formation of the PMOS transistors and NMOS transistors in the IC 100A will be omitted.

In operation S440, the electrical path 271 is formed between a bulk (e.g., N-type doped region 250c) of the PMOS transistor MP2 and a source (e.g., P-type doped region 260f) of the PMOS transistor MP3.

In operation S450, the electrical path 272 is formed between a drain (e.g., P-type doped region 260e) of the PMOS transistor MP3 and the P-type doped region 260d of the P-well region 240b.

Although illustrated and described in a particular order, the order of the operations may be performed in any logical order. For example, the order of operations S440-S450 can be exchanged. Furthermore, no extra mask is used to form the discharge circuit 150A for the IC 100A/100A1.

As described above, during the process of manufacturing the IC, the discharge path Path1 of FIG. 2B is present due to the gate of the PMOS transistor MP3 being a floating gate, and the charges accumulated in the deep N-well region 220 are discharged to the P-type substrate 210 through the discharge path Path1.

Figure 5:
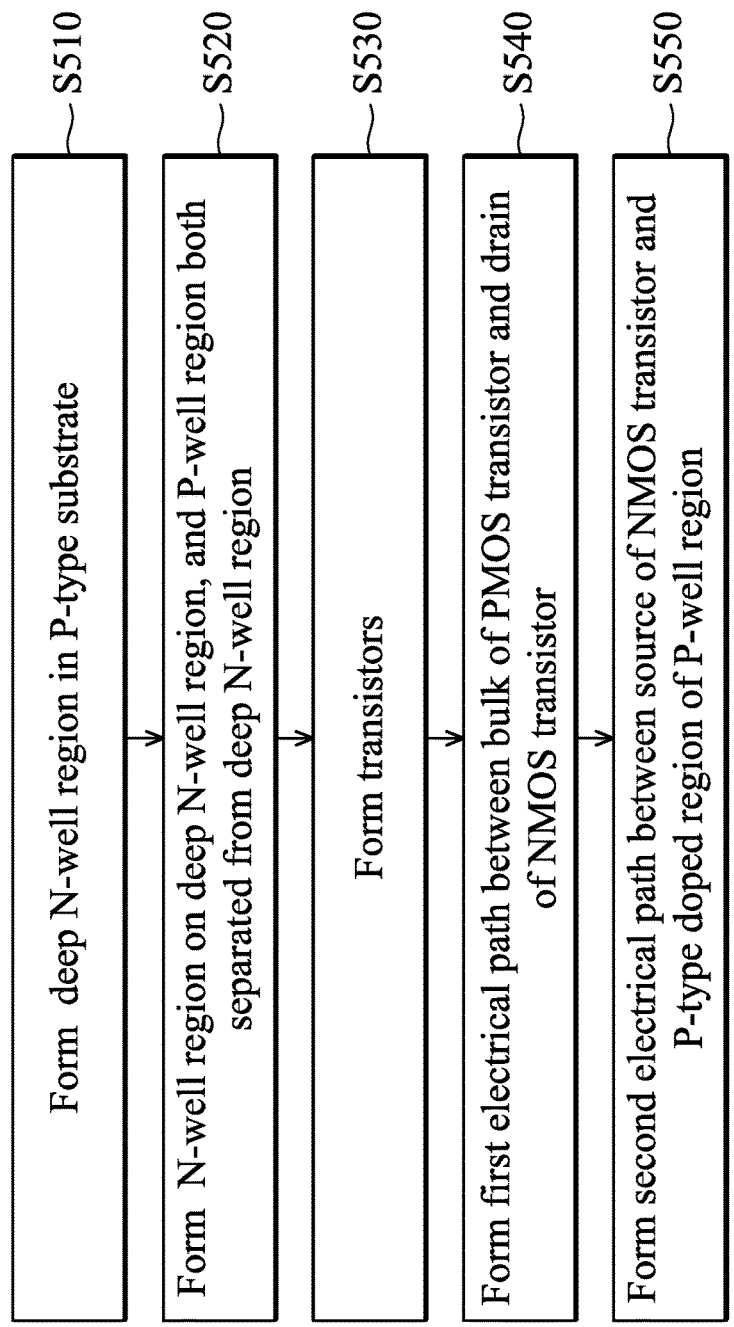
FIG. 5 shows a simplified flowchart illustrating a method for forming the integrated circuit of FIG. 3B, in accordance with some embodiments of the disclosure.

FIG. 5 shows a simplified flowchart illustrating a method for forming the integrated circuit 100B of FIG. 3B, in accordance with some embodiments of the disclosure.

In operation S510, the deep N-well region 220 is formed in the P-type substrate 210 of the IC 100B.

In operation S520, the N-well regions 230a through 230c and the P-well regions 240a through 240c are formed. The N-well regions 230a and 230b and the P-well region 240a are formed on the deep N-well region 220. Furthermore, the N-well region 230c and the P-well region 240c are formed and separated from the deep N-well region 220. Furthermore, the N-type doped regions and the P-type doped regions are formed in the corresponding well regions. As described above, the P-well region 240c is divided into the P-well regions 240c1 and 240c2. Furthermore, the P-well regions 240c1 and 240c2 are separated from each other.

In operation S530, the transistors of the integrated circuit 100B are formed. For example, the PMOS transistor MP2 is formed in the N-well region 230b. The NMOS transistor MN3 is formed in the P-well region 240c. The inverter INV3 is formed in the P-type substrate 210.

In order to simplify the description, details of the formation of the PMOS transistors and the NMOS transistors in the IC 100B will be omitted.

In operation S540, the electrical path 277 is formed between a bulk (e.g., N-type doped region 250c) of the PMOS transistor MP2 and a drain (e.g., N-type doped region 250h) of the NMOS transistor MN3.

In operation S550, the electrical path 278 is formed between a source (e.g., N-type doped region 250g) of the NMOS transistor MN3 and the P-type doped region 260j of the P-well region 240c.

Although illustrated and described in a particular order, the order of the operations may be performed in any logical order. For example, the order of operations S540-S550 can be exchanged. Furthermore, no extra mask is used to form the discharge circuit 150B for the IC 100B/100B1.

As described above, during the process of manufacturing the IC, the discharge path Path2 of FIG. 3B is present due to the gate of the NMOS transistor MN3 being a floating gate, and the charges accumulated in the deep N-well region 220 are discharged to the P-type substrate 210 through the discharge path Path2.

Embodiments of IC structures and methods for forming the IC structures are provided. By using the discharge circuit 150A of FIG. 2B or 150B of FIG. 3B arranged between the power line VDD2 corresponding to the deep N-well region 220 and a ground, a charged-device model is used to provide a discharge path Path1 of FIG. 2B or Path2 of FIG. 3B during the manufacturing process, so as to discharge the charges 120 accumulated in the deep N-well region 220 without passing through the transistors (e.g., the NMOS transistor MN1) coupled to the electrical path 110, so as to avoid damaging the gate (e.g., gate oxide or gate dielectric) of the NMOS transistors. Furthermore, the discharge path Path1 or Path2 will disappear during normal operation of the IC. By using the discharge circuit 150A or 150B, no protection diode is used in the discharge path Path1 or Path2. Due to the channel current provided by the discharge circuit 150A or 150B being greater than the diode reverse current of the protection diode, the discharge circuit 150A or 150B can prevent damage more effectively. Furthermore, no additional diode is added in signal paths of the IC, thereby no function of the IC will be impacted.

In some embodiments, an integrated circuit (IC) structure is provided. The IC structure includes a P-type substrate, a deep N-well region in the substrate, a first N-well region on the deep N-well region, a first N-type doped region in the first N-well region, a second N-well region in the substrate, a first P-well region in the substrate, and a discharge circuit. The second N-well region and the first P-well region are separated from the deep N-well region. The discharge circuit includes a first P-type doped region in the first P-well region, a first PMOS transistor formed in the second N-well region, a first electrical path coupled between a source of the first PMOS transistor and the first N-type doped region, and a second electrical path coupled between a drain of the first PMOS transistor and the first P-type doped region.

In some embodiments, an integrated circuit (IC) structure is provided. The IC structure includes a P-type substrate, a deep N-well region in the substrate, a first N-well region on the deep N-well region, a first N-type doped region in the first N-well region, a first P-well region in the substrate, and a discharge circuit. The first P-well region is separated from the deep N-well region. The discharge circuit includes a first P-type doped region in the first P-well region, a first NMOS transistor formed in the first P-well region, a first electrical path coupled between a drain of the first NMOS transistor and the first N-type doped region, and a second electrical path coupled between a source of the first NMOS transistor and the first P-type doped region.

In some embodiments, a method for forming an integrated circuit structure is provided. A deep N-well region is formed in a P-type substrate. A first PMOS transistor is formed in a first N-well region on the deep N-well region. A P-well region is formed in the P-type substrate, wherein the P-well region is separated from the deep N-well region. A P-type doped region is formed in the P-well region. A transistor is formed in the P-type substrate. A first electrical path is formed between a bulk of the first PMOS transistor and a drain/source of the transistor. A second electrical path is formed between the first P-type doped region and another drain/source of the transistor.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) structure, comprising:
  a P-type substrate;
  a deep N-well region in the P-type substrate;

a first N-well region on the deep N-well region;
a first N-type doped region in the first N-well region;
a second N-well region in the P-type substrate and separated from the deep N-well region;
a first P-well region in the P-type substrate and separated from the deep N-well region; and
a discharge circuit, comprising:
a first P-type doped region in the first P-well region;
a first PMOS transistor formed in the second N-well region;
a first electrical path coupled between a source of the first PMOS transistor and the first N-type doped region; and
a second electrical path coupled between a drain of the first PMOS transistor and the first P-type doped region.

2. The IC structure as claimed in claim 1, wherein a discharge path is formed from the deep N-well region to the P-type substrate through the first N-well region, the first N-type doped region, the first electrical path, a channel of the first PMOS transistor, the second electrical path, the first P-type doped region and the first P-well region in sequence.

3. The IC structure as claimed in claim 2, wherein charges accumulated in the deep N-well region are discharged through the discharge path.

4. The IC structure as claimed in claim 1, wherein the discharge circuit further comprises:
an inverter, having an input terminal coupled to the first P-type doped region and an output terminal coupled to a gate of the first PMOS transistor,
wherein when the inverter is powered, the first PMOS transistor is turned off by the inverter.

5. The IC structure as claimed in claim 1, further comprising:
a second P-well region on the deep N-well region;
a second PMOS transistor formed in the first N-well region;
a first NMOS transistor formed in the second P-well region; and
a third electrical path coupled between a drain of the second PMOS transistor and a drain of the first NMOS transistor,
wherein a source of the second PMOS transistor is coupled to the source of the first PMOS transistor and the first N-type doped region through the first electrical path,
wherein the first N-type doped region forms a bulk of the second PMOS transistor.

6. The IC structure as claimed in claim 5, further comprising:
a third P-well region in the P-type substrate and separated from the deep N-well region;
a third PMOS transistor formed in the second N-well region or a third N-well region; and
a second NMOS transistor formed in the third P-well region,
wherein gates of the third PMOS transistor and the second NMOS transistor are coupled to the drains of the second PMOS transistor and the first NMOS transistor through the third electrical path.

7. The IC structure as claimed in claim 6, further comprising:
a second N-type doped region in the second N-well region and between the first and third PMOS transistors,
wherein the second N-type doped region is coupled to the first N-type doped region,
wherein the second N-type doped region forms a bulk of the first PMOS transistor.

8. The IC structure as claimed in claim 6, further comprising:
a second N-type doped region in the second N-well region and between the first and third PMOS transistors,
wherein the second N-type doped region is coupled to a source of the third PMOS transistor through a fourth electrical path,
wherein the second N-type doped region forms a bulk of the first PMOS transistor.

9. An integrated circuit (IC) structure, comprising:
a P-type substrate;
a deep N-well region in the P-type substrate;
a first N-well region on the deep N-well region;
a first N-type doped region in the first N-well region;
a first P-well region in the P-type substrate and separated from the deep N-well region; and
a discharge circuit, comprising:
a first P-type doped region in the first P-well region;
a first NMOS transistor formed in the first P-well region;
a first electrical path coupled between a drain of the first NMOS transistor and the first N-type doped region;
a second electrical path coupled between a source of the first NMOS transistor and the first P-type doped region; and
an inverter, having an input terminal coupled to a power line and an output terminal coupled to a gate of the first NMOS transistor.

10. The IC structure as claimed in claim 9, wherein a discharge path is formed from the deep N-well region to the P-type substrate through the first N-well region, the first N-type doped region, the first electrical path, a channel of the first NMOS transistor, the second electrical path, the first P-type doped region and the first P-well region in sequence.

11. The IC structure as claimed in claim 10, wherein charges accumulated in the deep N-well region are discharged through the discharge path.

12. The IC structure as claimed in claim 9,
wherein when the inverter is powered, the first NMOS transistor is turned off by the inverter.

13. The IC structure as claimed in claim 9, further comprising:
a second P-well region on the deep N-well region;
a first PMOS transistor formed in the first N-well region;
a second NMOS transistor formed in the second P-well region; and
a third electrical path coupled between a drain of the first PMOS transistor and a drain of the second NMOS transistor,
wherein a source of the first PMOS transistor is coupled to the drain of the first NMOS transistor and the first N-type doped region through the first electrical path,
wherein the first N-type doped region forms a bulk of the first PMOS transistor.

14. The IC structure as claimed in claim 13, further comprising:
a second N-well region in the P-type substrate and separated from the deep N-well region;
a second PMOS transistor formed in the second N-well region; and
a third NMOS transistor formed in the first P-well region or a third P-well region,
wherein gates of the second PMOS transistor and the third NMOS transistor are coupled to the drains of the first PMOS transistor and the second NMOS transistor through the third electrical path.

15. An integrated circuit (IC) structure, comprising:
a P-type substrate;
a deep N-well region in the P-type substrate;

a first N-well region on the deep N-well region;

a P-well region in the P-type substrate and separated from the deep N-well region;

a P-type doped region in the P-well region;

a first PMOS transistor in the first N-well region;

a transistor on the P-type substrate;

an inverter on the P-type substrate;

a first electrical path between a bulk of the first PMOS transistor and one of drain and source of the transistor; and a second electrical path between the P-type doped region and the other drain or source of the transistor.

16. The IC structure as claimed in claim 15, wherein a discharge path is formed from the deep N-well region to the P-type substrate through the bulk of the first PMOS transistor, the first electrical path, a channel of the transistor, the second electrical path, the P-type doped region, and the P-well region in sequence, wherein charges accumulated in the deep N-well region are discharged through the discharge path.

17. The IC structure as claimed in claim 15, wherein an output terminal of the inverter is coupled to a gate of the transistor.

18. The IC structure as claimed in claim 17, wherein the transistor is a PMOS transistor formed in a second N-well region separated from the deep N-well region, and an input terminal of the inverter is coupled to the P-type doped region.

19. The IC structure as claimed in claim 17, wherein the transistor is an NMOS transistor formed in the P-well region, and an input terminal of the inverter is coupled to a power line.

20. The IC structure as claimed in claim 15, further comprising:

a first NMOS transistor on the deep N-well region;

a second NMOS transistor separated from the deep N-well region;

a second PMOS transistor separated from the deep N-well region; and a third electrical path configured to connect a drain of the first PMOS transistor, a drain of the first NMOS transistor, a gate of the second PMOS transistor, and a gate of the second NMOS transistor.

* * * * *